United States Patent
Nakazawa et al.

(10) Patent No.: US 10,659,003 B2
(45) Date of Patent: May 19, 2020

(54) ELECTRONIC COMPONENT WITH TWO SUBSTRATES ENCLOSING FUNCTIONAL ELEMENT AND INSULATING FILM THEREIN

(71) Applicant: TAIYO YUDEN CO., LTD., Tokyo (JP)

(72) Inventors: Hidetaro Nakazawa, Tokyo (JP); Takashi Matsuda, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 123 days.

(21) Appl. No.: 15/803,699

(22) Filed: Nov. 3, 2017

(65) Prior Publication Data

US 2018/0159499 A1    Jun. 7, 2018

(30) Foreign Application Priority Data

Dec. 5, 2016    (JP) .................................. 2016-235938

(51) Int. Cl.
*H03H 9/02* (2006.01)
*H03H 9/05* (2006.01)
(Continued)

(52) U.S. Cl.
CPC .... *H03H 9/02834* (2013.01); *H03H 9/02102* (2013.01); *H03H 9/02535* (2013.01);
(Continued)

(58) Field of Classification Search
CPC ...... H03H 9/08; H03H 9/1035; H03H 9/1042; H03H 9/1085; H03H 9/568; H03H 9/605;
(Continued)

(56) References Cited

U.S. PATENT DOCUMENTS 7,445,968 B2 * 11/2008 Harrison ............. H01L 23/3677
                                                        257/660
7,940,146 B2 *  5/2011 Oda ........................ H03H 3/08
                                                        29/25.35
(Continued)

FOREIGN PATENT DOCUMENTS

JP    2000-196407 A  *  7/2000
JP    2005-223580 A     8/2005
(Continued)

OTHER PUBLICATIONS

Japanese Office Action dated Jan. 29, 2019, in a counterpart Japanese patent application No. 2016-235938. (A machine translation (not reviewed for accuracy) attached.).

*Primary Examiner* — Barbara Summons
(74) *Attorney, Agent, or Firm* — Chen Yoshimura LLP

(57) ABSTRACT

An electronic component includes: a first substrate; a second substrate that includes a functional element formed on a lower surface of the second substrate, the second substrate being mounted on the first substrate so that the functional element faces an upper surface of the first substrate across an air gap; and an insulating film that is located on the upper surface of the first substrate, overlaps with at least a part of the functional element in plan view, faces the functional element across the air gap, and has a film thickness that is more than half of a distance between a lower surface of the functional element and the upper surface of the first substrate.

10 Claims, 16 Drawing Sheets

(51) Int. Cl.
  *H05K 1/02*  (2006.01)
  *H03H 9/72*  (2006.01)
  *H03H 9/10*  (2006.01)

(52) U.S. Cl.
  CPC .......... *H03H 9/059* (2013.01); *H03H 9/0523* (2013.01); *H03H 9/0571* (2013.01); *H03H 9/0576* (2013.01); *H03H 9/1042* (2013.01); *H03H 9/1085* (2013.01); *H03H 9/72* (2013.01); *H05K 1/0203* (2013.01); *H05K 1/0209* (2013.01); *H05K 1/0243* (2013.01); *H05K 2201/1006* (2013.01); *H05K 2201/10068* (2013.01); *H05K 2201/10083* (2013.01); *H05K 2201/10568* (2013.01); *H05K 2201/10575* (2013.01); *H05K 2203/1327* (2013.01)

(58) Field of Classification Search
  CPC ...... H03H 9/6483; H03H 9/6489; H03H 9/72; H03H 9/706; H03H 9/725; H03H 9/02102; H03H 9/02535; H03H 9/02834; H03H 9/0523; H03H 9/0571; H03H 9/0576; H03H 9/058; H03H 9/059; H05K 1/0203; H05K 1/0209; H05K 1/0243; H05K 2203/1327; H05K 2201/1006; H05K 2201/10068; H05K 2201/10083; H05K 2201/10568; H05K 2201/10575
  USPC ..... 333/133, 187, 189, 193–196; 310/313 B, 310/313 D, 341, 346, 347
  See application file for complete search history.

(56) References Cited

U.S. PATENT DOCUMENTS

| | | | |
|---|---|---|---|
| 8,704,424 B2 * | 4/2014 | Yamaji | H03H 9/1092 |
| | | | 310/313 R |
| 2018/0367116 A1 * | 12/2018 | Goto | H03F 3/195 |

FOREIGN PATENT DOCUMENTS

| | | | |
|---|---|---|---|
| JP | 2008-16909 A | | 1/2008 |
| JP | 2011-151638 A | * | 8/2011 |
| JP | 2013-118444 a | | 6/2013 |
| JP | 2015-103888 A | | 6/2015 |
| JP | 2015-204531 A | | 11/2015 |
| JP | 2016-58964 A | | 4/2016 |

* cited by examiner

US 10,659,003 B2

ELECTRONIC COMPONENT WITH TWO SUBSTRATES ENCLOSING FUNCTIONAL ELEMENT AND INSULATING FILM THEREIN

CROSS-REFERENCE TO RELATED APPLICATION

This application is based upon and claims the benefit of priority of the prior Japanese Patent Application No. 2016-235938, filed on Dec. 5, 2016, the entire contents of which are incorporated herein by reference.

FIELD

A certain aspect of the present invention relates to an electronic component.

BACKGROUND

Acoustic wave elements such as film bulk acoustic resonators (FBARs) or surface acoustic wave (SAW) resonators have been used for bandpass filters in various circuits that process radio signals in the frequency band ranging from 45 MHz to 4 GHz typified by mobile phones.

As a method of mounting a functional element such as the acoustic wave element, there have been known a method that flip-chip mounts a chip including the functional element formed on the lower surface of the chip on a substrate as disclosed in, for example, Japanese Patent Application Publication Nos. 2015-204531, 2005-223580, 2015-103888, and 2016-58964. The functional element such as an acoustic wave element faces the upper surface of the substrate across an air gap. It has been known to provide an insulating film on the upper surface of the substrate to inhibit the short circuit between an inductor located on the upper surface of the substrate and the acoustic wave element as disclosed in, for example, Japanese Patent Application Publication No. 2016-58964.

The electronic components including, for example, the acoustic wave elements are desired to be smaller as the functions of mobile phones and smart phones increase. On the other hand, as the power of power amplifiers for transmitting radio waves becomes higher, higher power durability is desired. To achieve the electronic component having smaller size and higher power durability, it may be considered to enhance the heat release performance from the functional element. However, when the functional element faces the upper surface of the substrate across an air gap, heat fails to be released from the lower surface of the functional element.

SUMMARY OF THE INVENTION

According to an aspect of the present invention, there is provided an electronic component including: a first substrate; a second substrate that includes a functional element formed on a lower surface of the second substrate, the second substrate being mounted on the first substrate so that the functional element faces an upper surface of the first substrate across an air gap; and an insulating film that is located on the upper surface of the first substrate, overlaps with at least a part of the functional element in plan view, faces the functional element across the air gap, and has a film thickness that is more than half of a distance between a lower surface of the functional element and the upper surface of the first substrate.

DETAILED DESCRIPTION

Hereinafter, embodiments will be described with reference to the accompanying drawings.

First Embodiment

Figure 1A:
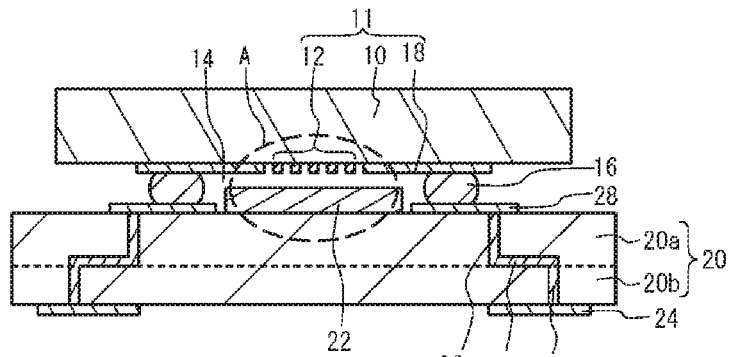
FIG. 1A is a cross-sectional view of an electronic component in accordance with a first embodiment.
Figure 1B:
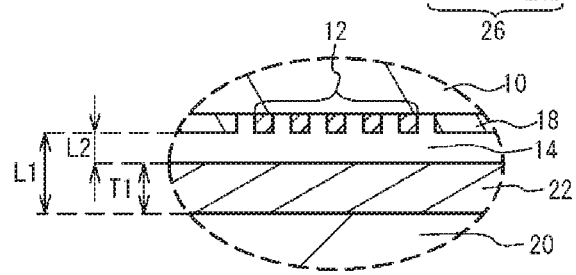
FIG. 1B is an enlarged view of a region A in FIG. 1A.
Figure 1C:
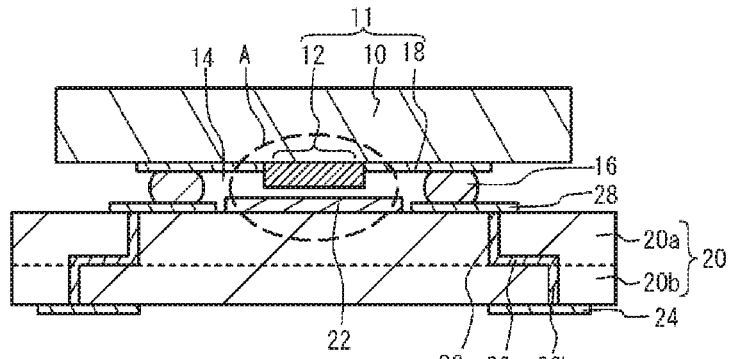
FIG. 1C is a cross-sectional view of an electronic component in accordance with a first variation of the first embodiment.
Figure 1D:
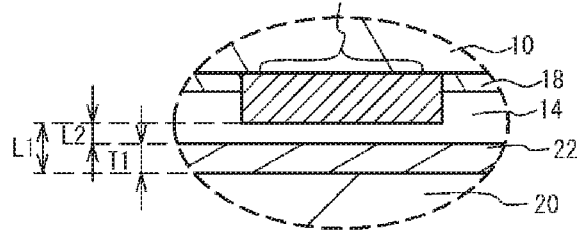
FIG. 1D is an enlarged view of the region A in FIG. 1C.

FIG. 1A is a cross-sectional view of an electronic component in accordance with a first embodiment, FIG. 1B is an enlarged view of a region A in FIG. 1A, FIG. 1C is a cross-sectional view of an electronic component in accordance with a first variation of the first embodiment, and FIG. 1D is an enlarged view of the region A in FIG. 1C.

As illustrated in FIG. 1A and FIG. 1C, a substrate 10 is mounted on the upper surface of a substrate 20. The substrate 20 is an insulating substrate, and is, for example, a ceramic substrate made of high temperature co-fired ceramic (HTCC) or low temperature co-fired ceramic (LTCC) or a resin substrate. The substrate 20 includes a plurality of insulating layers 20a and 20b that are stacked. Metal layers 28 and 26c are respectively formed on the upper surfaces of the insulating layers 20a and 20b. A metal layer 24 is formed on the lower surface of the insulating layer 20b. Via wirings 26a and 26b respectively penetrating through the insulating layers 20a and 20b are formed. The via wiring 26a electrically connects the metal layers 28 and 26c, while the via wiring 26b electrically connects the metal layers 26c and 24.

The metal layer 28 located on the upper surface of the substrate 20 forms, for example, a pad to which a bump 16 is bonded and a wiring line. The metal layer 24 is, for example, an external terminal for providing the electrical connection with the outside, and is, for example, a foot pad. The via wirings 26a and 26b and the metal layer 26c form an internal wiring line 26 connecting the metal layers 24 and 28. The metal layers 24 and 28 and the internal wiring line 26 are metal layers such as copper layers, gold layers, or aluminum layers. An insulating film 22 is located on the upper surface of the substrate 20. The insulating film 22 is made of, for example, an organic insulating material such as resin or an inorganic insulating material such as silicon oxide. When the insulating film 22 is a resin film, the insulating film 22 is formed on the substrate 20 by, for example, printing, and dried through a heat treatment.

A device chip 11 includes the substrate 10, a functional element 12, and a metal layer 18. The functional element 12 and the metal layer 18 are located on the lower surface of the substrate 10. The functional element 12 is a surface acoustic wave element in FIG. 1A and FIG. 1B, and is a piezoelectric thin film resonator in FIG. 1C and FIG. 1D. The metal layer 18 forms a pad to which the bump 16 is bonded and a wiring line.

The device chip 11 is flip-chip (facedown) mounted on the substrate 20 through the bumps 16. The functional element 12 faces the upper surface of the substrate 20 and the upper surface of the insulating film 22 across an air gap 14. Since the functional element 12 is exposed to the air gap 14, the vibration of the functional element 12 is not restrained. The bump 16 is, for example, a copper bump, a gold bump, or a solder bump.

As illustrated in FIG. 1B and FIG. 1D, the distance between the upper surface of the substrate 20 and the lower surface of the functional element 12 is represented by L1, the distance between the upper surface of the insulating film 22 and the lower surface of the functional element 12 is represented by L2, and the film thickness of the insulating film 22 is represented by T1. In the first embodiment and the first variation thereof, L1>T1≥L1/2, and T1≥L2. As described above, the distance L2 between the functional element 12 and the insulating film 22 is small. Thus, the heat generated in the functional element 12 is released through the insulating film 22.

Figure 2A:
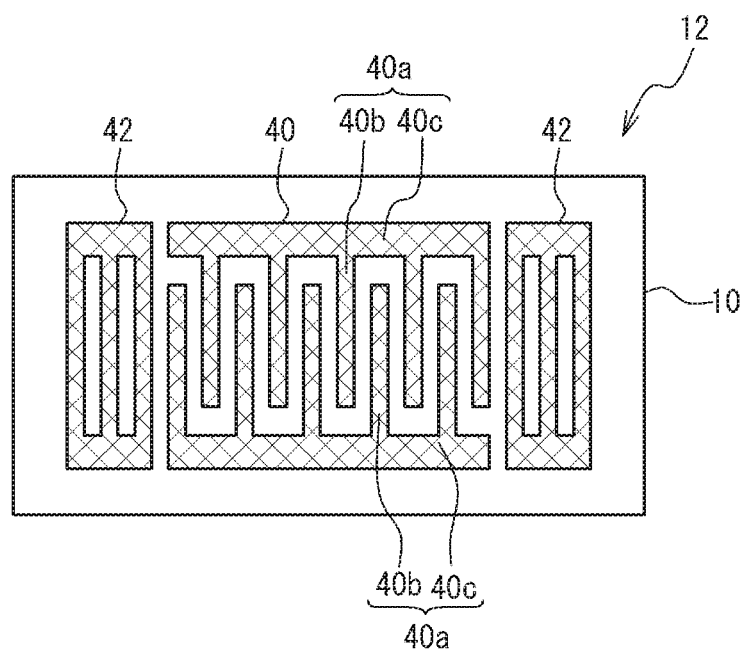
FIG. 2A is a plan view of a functional element in the first embodiment.
Figure 2B:
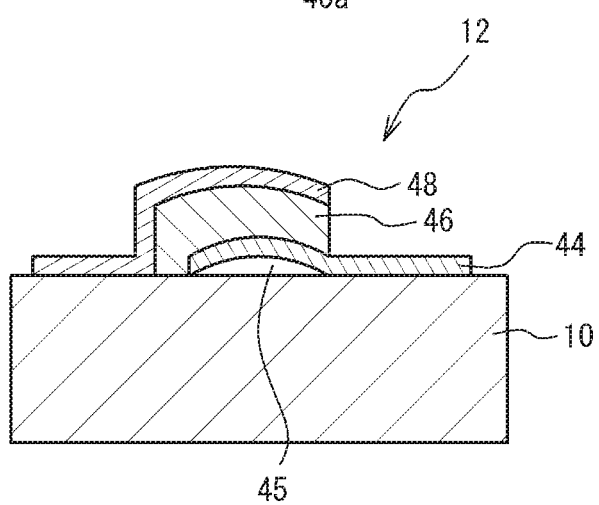
FIG. 2B is a cross-sectional view of the functional element in the first variation of the first embodiment.

FIG. 2A is a plan view of the functional element in the first embodiment, and FIG. 2B is a cross-sectional view of the functional element in the first variation of the first embodiment. As illustrated in FIG. 2A, an interdigital transducer (IDT) 40 and reflectors 42 are formed on the substrate 10. The IDT 40 includes a pair of comb-shaped electrodes 40a facing each other. The comb-shaped electrode 40a includes a plurality of electrode fingers 40b and a bus bar 40c to which the electrode fingers 40b are coupled. The reflectors 42 are located at both sides of the IDT 40. The IDT 40 excites a surface acoustic wave on the substrate 10. The substrate 10 is a piezoelectric substrate such as, for example, a lithium tantalate substrate or a lithium niobate substrate. The IDT 40 and the reflectors 42 are formed of, for example, an aluminum film or a copper film. The substrate 10 may be bonded on the lower surface of a support substrate such as a sapphire substrate, an alumina substrate, a spinel substrate, or a silicon substrate. A protective film or a temperature compensation film covering the IDT 40 and the reflectors 42 may be provided. In this case, the surface acoustic wave resonator and the protective film or the temperature compensation film function as the functional element 12 as a whole.

As illustrated in FIG. 2B, a piezoelectric film 46 is located on the substrate 10. A lower electrode 44 and an upper electrode 48 are located so as to sandwich the piezoelectric film 46. An air gap 45 is formed between the lower electrode 44 and the substrate 10. The lower electrode 44 and the upper electrode 48 excite an acoustic wave in the thickness extension mode inside the piezoelectric film 46. The lower electrode 44 and the upper electrode 48 are formed of, for example, a metal film such as a ruthenium film. The piezoelectric film 46 is, for example, an aluminum nitride film. The substrate 10 is for example, a semiconductor substrate such as a silicon substrate or a gallium arsenide substrate, or an insulating substrate such as a sapphire substrate, an alumina substrate, a spinel substrate, or a glass substrate. As illustrated in FIG. 2A and FIG. 2B, the functional element 12 includes an electrode that excites the acoustic wave. Thus, the functional element 12 is covered with the air gap 14 so as not to restrain the acoustic wave.

Figure 3A:
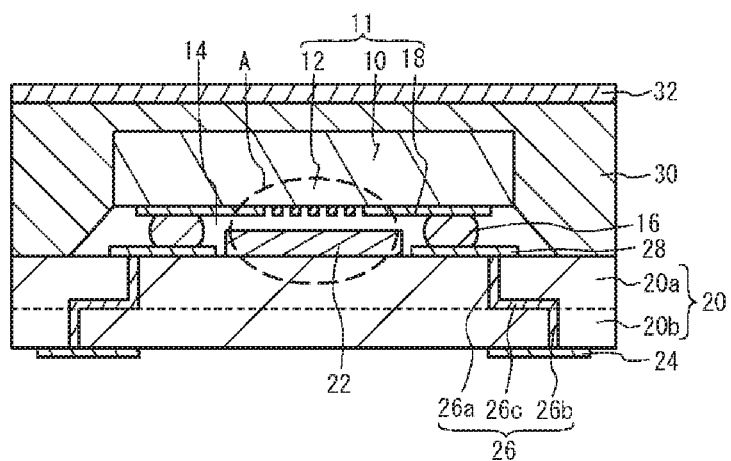
FIG. 3A and FIG. 3B are cross-sectional views of electronic components in accordance with second and third variations of the first embodiment, respectively.
Figure 3B:
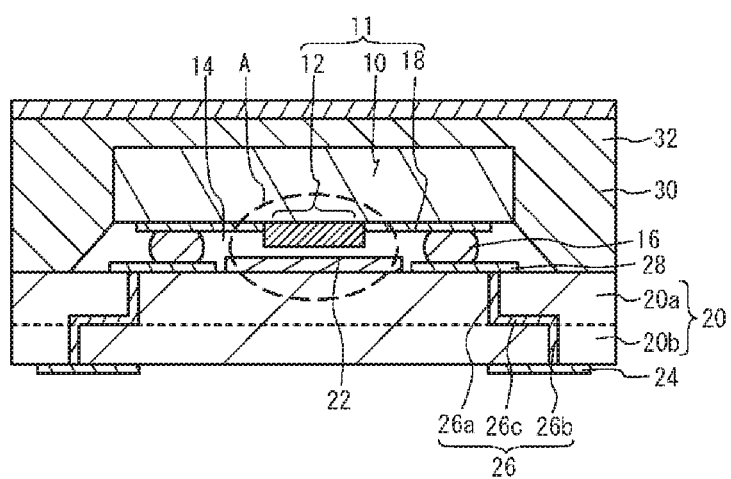

FIG. 3A and FIG. 3B are cross-sectional views of electronic components in accordance with second and third variations of the first embodiment, respectively. The enlarged views of the region A in FIG. 3A and FIG. 3B are respectively the same as those in FIG. 1B and FIG. 1D.

As illustrated in FIG. 3A and FIG. 3B, a sealing portion 30 is located so as to surround the substrate 10 in plan view. The sealing portion 30 is bonded with the upper surface of the substrate 20. A lid 32 is located on the sealing portion 30 and the substrate 10. The sealing portion 30 is made of metal such as solder or an insulating material such as resin. The lid 32 is a metal plate or an insulating plate. The sealing portion 30 hermetically seals the functional element 12 in the air gap 14. Other structures are the same as those of the first embodiment and the first variation thereof, and the description thereof is thus omitted.

Second Embodiment

Figure 4:
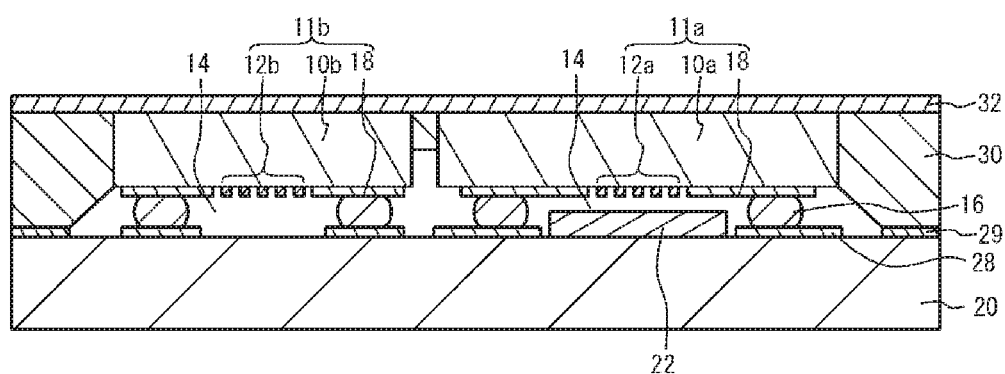
FIG. 4 is a cross-sectional view of a duplexer in accordance with a second embodiment.

A second embodiment is an exemplary duplexer. FIG. 4 is a cross-sectional view of a duplexer in accordance with the second embodiment. As illustrated in FIG. 4, device chips 11a and 11b are flip-chip mounted on the substrate 20. In the device chip 11a, a functional element 12a is located on the lower surface of a substrate 10a. In the device chip 11b, a functional element 12b is located on the lower surface of a substrate 10b. A ring-shaped metal layer 29 is located on the upper surface of the substrate 20 so as to surround the device chips 11a and 11b. The sealing portion 30 is located so as to surround the device chips 11a and 11b. The sealing portion 30 is made of solder, and is bonded with the ring-shaped metal layer 29. The lid 32 is located on the upper surfaces of the sealing portion 30 and the device chips 11a and 11b. The functional element 12a faces the insulating film 22, which is located on the upper surface of the substrate 20, across the air gap 14. Other structures are the same as those of the second variation of the first embodiment, and the description thereof is thus omitted.

Figure 5A:
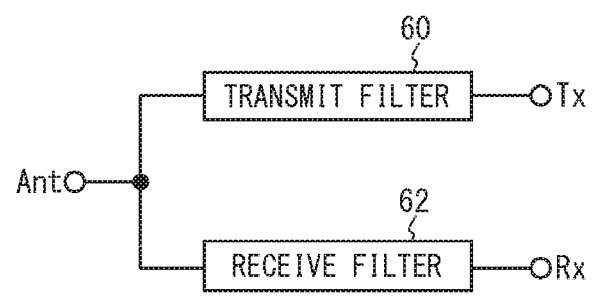
FIG. 5A is a circuit diagram of the duplexer in accordance with the second embodiment.
Figure 5B:
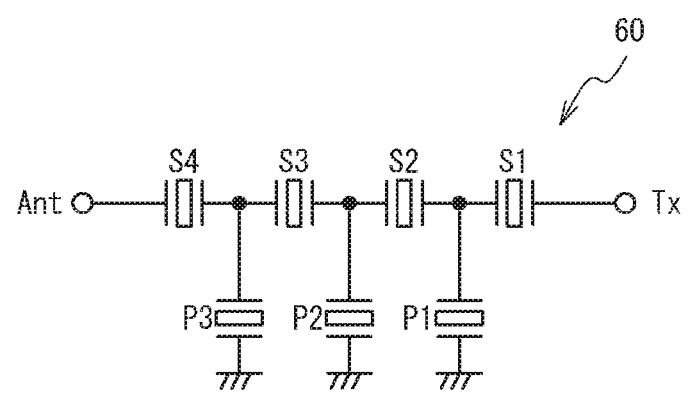
FIG. 5B is a circuit diagram of a transmit filter.

FIG. 5A is a circuit diagram of the duplexer in accordance with the second embodiment, and FIG. 5B is a circuit diagram of a transmit filter. As illustrated in FIG. 5A, a transmit filter 60 is located between a common terminal Ant and a transmit terminal Tx. A receive filter 62 is located between the common terminal Ant and a receive terminal Rx. The transmit filter 60 transmits transmission signals to the common terminal Ant among high-frequency signals input from the transmit terminal Tx, and suppresses signals with other frequencies. The receive filter 62 transmits reception signals to the receive terminal Rx among high-frequency signals input from the common terminal Ant, and suppresses signals with other frequencies. The transmit filter 60 is formed in the device chip 11a, and includes the functional element 12a. The receive filter 62 is formed in the device chip 11b, and includes the functional element 12b.

As illustrated in FIG. 5B, the transmit filter 60 includes series resonators S1 through S4 and parallel resonators P1 through P3. The series resonators S1 through S4 are connected in series between the transmit terminal Tx and the common terminal Ant. The parallel resonators P1 through P3 are connected in parallel between the transmit terminal Tx and the common terminal Ant.

Figure 6:
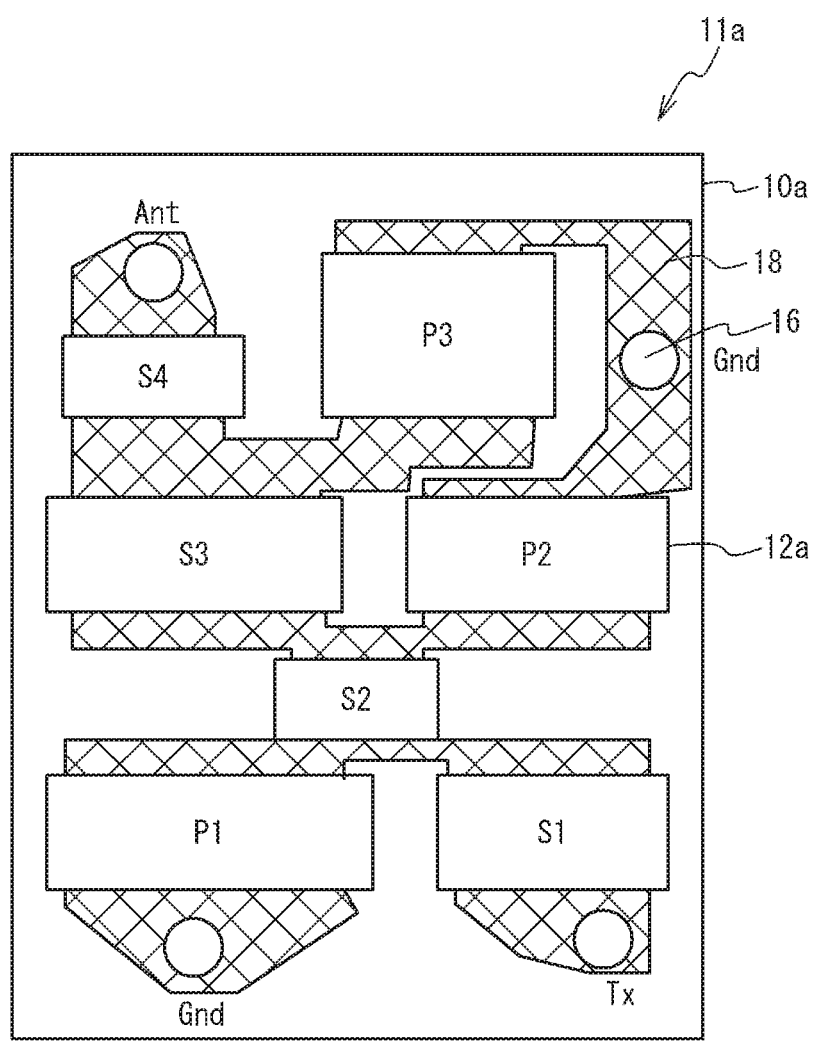
FIG. 6 is a plan view of a device chip in the second embodiment.

FIG. 6 is a plan view of the device chip in the second embodiment. FIG. 6 is a plan view transparently illustrating the lower surface of the device chip 11a from above. As illustrated in FIG. 6, a plurality of functional elements 12a and the metal layer 18 are located on the lower surface of the substrate 10a. The functional element 12a is the surface acoustic wave resonator illustrated in FIG. 2A. The functional elements 12a include the series resonators S1 through S4 and the parallel resonators P1 through P3. The metal layer 18 forms wiring lines and pads. The wiring lines interconnect the functional elements 12a. The pads are coupled to the functional elements 12a. The bumps 16 are located on the pads. The bumps 16 correspond to the common terminal Ant, the transmit terminal Tx, and ground terminals Gnd.

Figure 7:
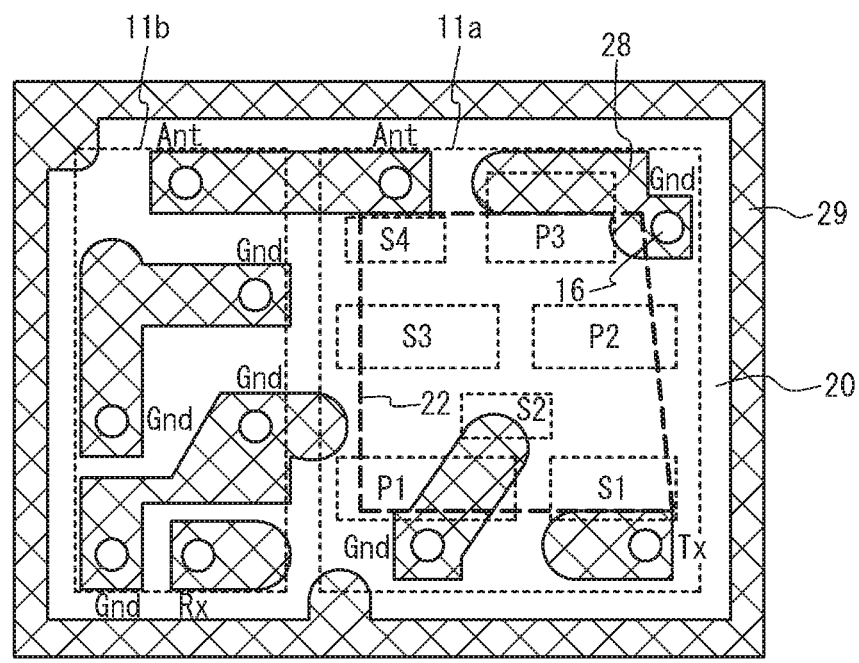
FIG. 7 is a plan view of a substrate in the second embodiment.

FIG. 7 is a plan view of a substrate in the second embodiment. The device chips 11a and 11b and the resonators in the device chip 11a are indicated by dashed lines, and the insulating film 22 is indicated by a bold dashed line. As illustrated in FIG. 7, the metal layer 28 and the ring-shaped metal layer 29 are located on the upper surface of the substrate 20. The ring-shaped metal layer 29 is located in the periphery of the upper surface of the substrate 20. The metal layer 28 forms wiring lines and pads. The wiring lines interconnect the pads. The bumps 16 are located on the pads. The bumps 16 correspond to the common terminal Ant, the transmit terminal Tx, the receive terminal Rx, and the ground terminals Gnd. The insulating film 22 overlaps with the resonators of the device chip 11a in plan view, but does not overlap with the device chip 11b in plan view. The insulating film 22 overlaps with the entire of the series resonator S2, and overlaps with the most part of each of other resonators. The insulating film 22 may overlap with the entire of the resonator in all the resonators, or may overlap with at least a part of the resonator in each resonator.

The temperature in the substrate 10a was simulated. The simulation conditions are as follows. The substrates 10a and 10b were assumed to be 42° rotated Y-cut X-propagation lithium tantalate substrates with a thickness of 250 µm. The substrate 20 was assumed to be an LTCC substrate with a thickness of 166 µm. The sealing portion 30 was assumed to be made of AgSn solder. The distance between the upper surface of the substrate 20 and the lower surface of the substrate 10a was assumed to be 20 µm. The thickness of the electrode finger of the surface acoustic wave resonator, which is the functional element 12a, is less than 1 µm. The distance between the upper surface of the substrate 10 and the lower surface of the functional element 12a is between 19 µm and 20 µm. The lid 32 is not provided, and the upper surfaces of the sealing portion 30 and the device chip 11a are exposed to the air. The insulating film 22 was assumed to be a resin film with a thermal conductivity of approximately 0.25 W/m·K, and the film thickness T1 thereof was assumed to be 5, 10, 15, 18, and 19 µm.

The transmit filter 60 and the receive filter 62 were respectively assumed to be a transmit filter and a receive filter for Band8 (transmit band: 880 to 915 MHz, receive band: 925 to 960 MHz) of Evolved Universal Terrestrial Radio Access (E-UTRA) Operating Band. A transmission signal of Band8 was input to the transmit terminal Tx. The applied electric power was set to 27 dBm, 28 dBm, and 28.5 dBm. The common terminal Ant and the receive terminal Rx were assumed to be terminated to ground via a 50Ω resistor. The maximum temperature of the lower surface in the substrate 10a was simulated.

Figure 8A:
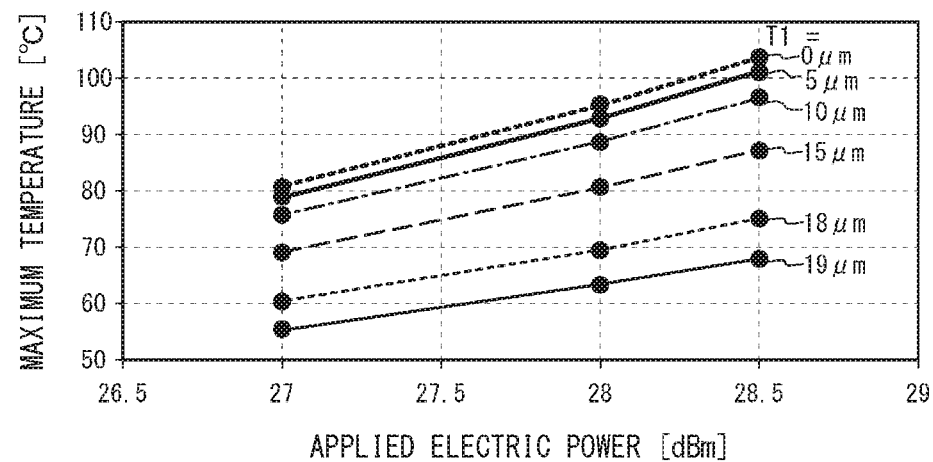
FIG. 8A is a graph of maximum temperature versus applied electric power.
Figure 8B:
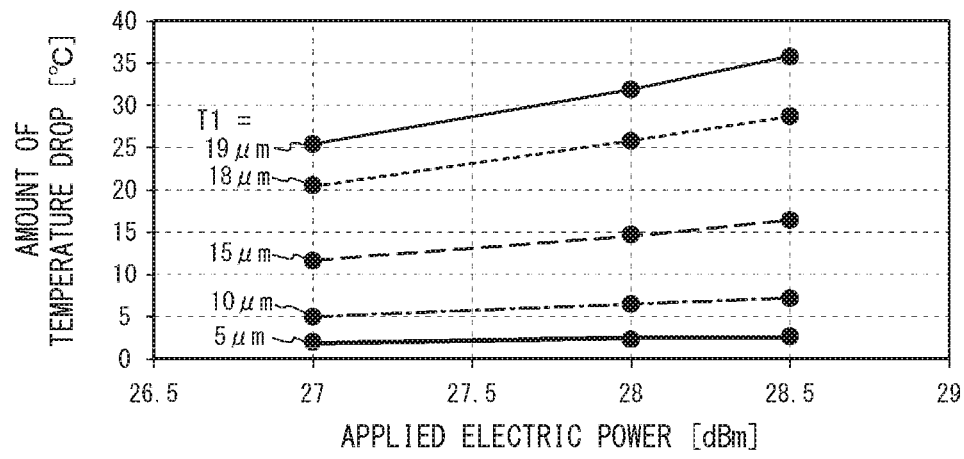
FIG. 8B is a graph of an amount of temperature drop versus applied electric power.

FIG. 8A is a graph of maximum temperature versus applied electric power, and FIG. 8B is a graph of an amount of temperature drop versus applied electric power. FIG. 8A presents the maximum temperature on the lower surface of the substrate 10a when the film thickness T1 of the insulating film 22 was varied from 0 µm to 19 µm. FIG. 8B presents the amount of temperature drop when the film thickness T1 of the insulating film 22 was varied from 5 µm to 19 µm. The amount of temperature drop is obtained by subtracting the maximum temperature on the lower surface of the substrate 10a when the insulating film 22 is provided from the maximum temperature on the lower surface of the substrate 10a when the film thickness T1 is 0 µm.

As illustrated in FIG. 8A and FIG. 8B, as the film thickness T1 of the insulating film 22 increases, the maximum temperature decreases. Especially when T1 exceeds 10 µm, the maximum temperature greatly decreases compared to the maximum temperature when the insulating film 22 is not provided. The location at which the maximum temperature is marked is the location corresponding to the series resonator S2 in FIG. 6.

Figure 9:
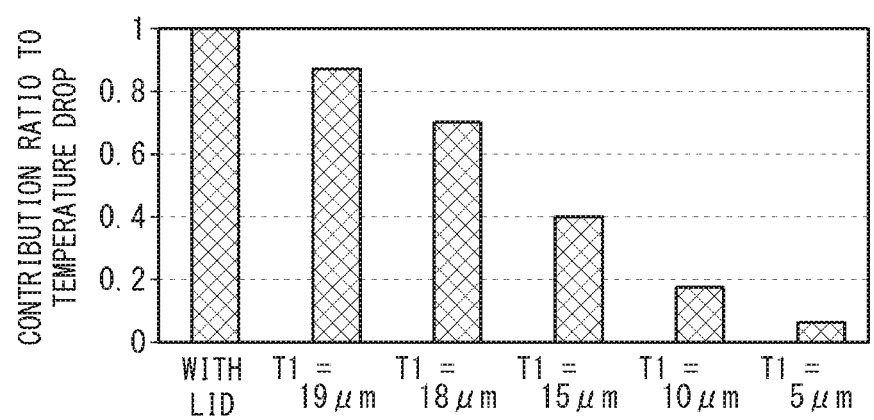
FIG. 9 is a graph indicating the contribution ratio to temperature drop.

FIG. 9 illustrates the contribution ratio to temperature drop. The contribution ratio to temperature drop is a value obtained by normalizing the amount of temperature drop when the lid 32 is not provided and the insulating film 22 is provided while the amount of temperature drop of the maximum temperature when the applied electric power is 27 dBm, the insulating film 22 is not provided, and the lid 32 (kovar with a film thickness of 25 µm) is provided is defined as 1.0. As illustrated in FIG. 9, when the film thickness of the insulating film 22 is 19 µm, the contribution ratio to temperature drop is approximately 0.86 of that when the lid 32 is provided, and approximately identical.

Figure 10:
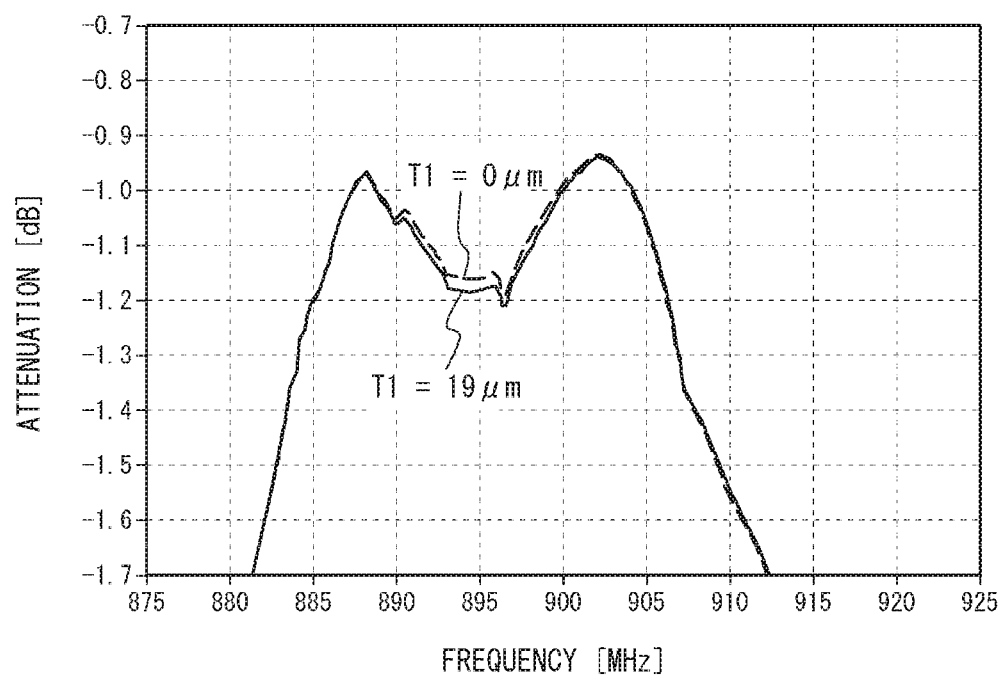
FIG. 10 illustrates transmission characteristics from a transmit terminal to a common terminal.

FIG. 10 illustrates transmission characteristics from the transmit terminal to the common terminal. The transmission characteristic when the film thickness T1 of the insulating film 22 is 0 µm is indicated by a dashed line, and the transmission characteristic when the film thickness T1 of the insulating film 22 is 19 µm is indicated by a solid line. As illustrated in FIG. 10, the increase in the insertion loss at 894.5 MHz due to the provision of the insulating film 22 is 0.023 dB. As described above, the insertion loss does not increase so much even when the insulating film 22 is provided.

In the first and second embodiments, the substrate 10 or 10a (a second substrate) including the functional element 12 or 12a formed on the lower surface thereof is mounted so that the functional element 12 or 12a faces the upper surface of the substrate 20 (a first substrate) across the air gap 14. Located on the upper surface of the substrate 20 is an insulating film that overlaps with at least a part of the functional element 12 or 12a in plan view and faces the functional element 12 or 12a across the air gap 14.

When the functional element 12 or 12a faces the substrate 20 across the air gap 14, the amount of heat released from the lower surface of the functional element 12 or 12a is small. When the upper surface of the substrate 20 is made to be close to the functional element 12 or 12a, the heat generated in the functional element 12 or 12a conducts to the substrate 20 by radiation or convection, and the temperature of the functional element 12 or 12a is thereby lowered. However, to provide the air gap 14 between the substrate 20 and the substrate 10, the bumps 16 are provided. The provision of the bumps 16 make it impossible to reduce the distance L1 between the lower surface of the functional element 12 or 12a and the upper surface of the substrate 20. Accordingly, the amount of heat released from the lower surface of the functional element 12 or 12a is not increased. Thus, the insulating film 22 is located on the upper surface of the substrate 20. This structure reduces the distance L2 between the lower surface of the functional element 12 or 12a and the upper surface of the insulating film 22. Accordingly, the heat generated in the functional element 12 or 12a is released through the insulating film 22. When a metal film is used instead of the insulating film 22, the upper surface of the metal film is located near the functional element 12 or 12a. Thus, the characteristics of the functional element 12 or 12a deteriorate.

To efficiently release heat from the functional element 12 or 12a, the film thickness T1 of the insulating film 22 is preferably more than half of the distance L1. This structure lowers the maximum temperature in the substrate 10a as in FIG. 8A through FIG. 9. T1 is preferably 75% or more of L1, more preferably 90% or more. Additionally, the distance L2 between the lower surface of the functional element 12 or 12a and the upper surface of the insulating film 22 is preferably T1 or less, more preferably T1/2 or less, further preferably T1/4 or less.

It is only required that the thermal conductivity of the insulating film 22 is greater than 0.025 W/m·K, which is the thermal conductivity of the air. However, to further increase the heat release effect, the thermal conductivity of the insulating film 22 is preferably more than five times the thermal conductivity of the air, more preferably more than ten times. Used as the insulating film 22 with a large thermal conductivity is epoxy resin, polyimide resin, silicon, solder resist, boron nitride, aluminum nitride, zinc oxide, or silicon oxide. To enhance the heat release performance, the insulating film 22 is preferably in direct contact with the upper surface of the substrate 20.

To enhance the heat release performance, the insulating film 22 is preferably located on the entire surface of the upper surface of the substrate 20 except the bumps 16. However, when the insulating film 22 is located near the functional element 12 or 12a and/or the wiring line through which high-frequency signals propagate, the characteristics may deteriorate. Thus, the insulating film 22 is preferably provided to the extent that the insulating film 22 contributes to the heat release performance but does not deteriorate the characteristics.

The device chip 11a generating more heat is a chip including the transmit filter 60. Thus, as in FIG. 7, the insulating film 22 is located so as to overlap with all the functional elements 12a forming the transmit filter 60 and not to overlap with the device chip 11b including the receive filter 62. Additionally, the insulating film 22 is not located on the metal layer 28 connected to the transmit terminal Tx and the common terminal Ant through which high-frequency signals propagate. This structure reduces the deterioration of the characteristics and enhances the heat release performance.

Figure 11:
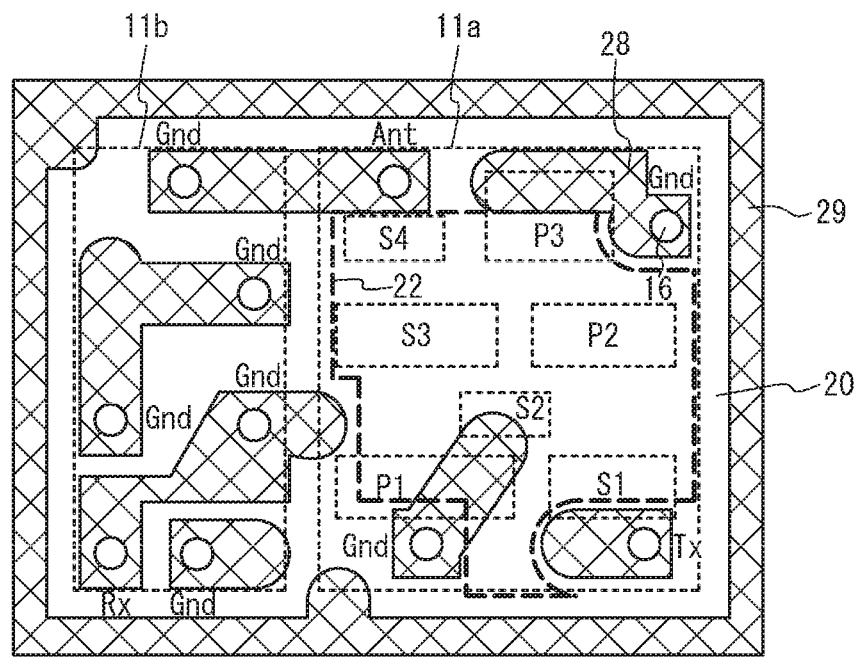
FIG. 11 is a plan view of the substrate in a first variation of the second embodiment.

FIG. 11 is a plan view of the substrate in a first variation of the second embodiment. As illustrated in FIG. 11, the insulating film 22 is not provided within a predetermined distance from the bump 16. This structure secures the margin for the bump 16 alignment. Other structures are the same as those of the second embodiment, and the description thereof is thus omitted.

Figure 12:
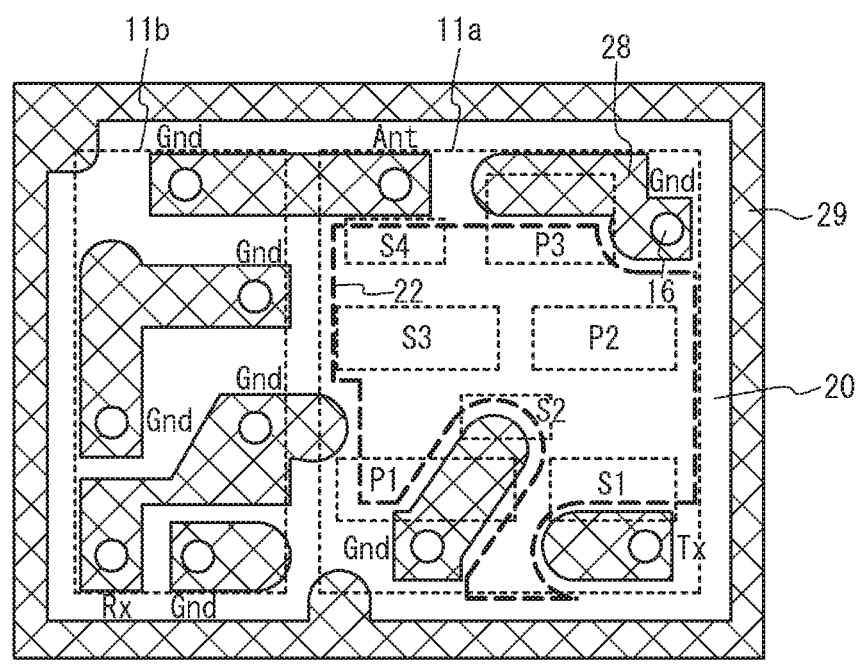
FIG. 12 is a plan view of the substrate in a second variation of the second embodiment.

FIG. 12 is a plan view of the substrate in a second variation of the second embodiment. As illustrated in FIG. 12, the insulating film 22 overlaps with none of the metal layers 28. In the region where the insulating film 22 overlaps with the metal layer 28, the upper surface of the insulating film 22 may come in contact with the functional element 12a and/or the metal layer 18. The contact may deteriorate the characteristics of the functional element 12a. In the second variation of the second embodiment, the insulating film 22 overlaps with none of the metal layers 28. This structure inhibits the deterioration of the characteristics. Other structures are the same as those of the second embodiment, and the description thereof is thus omitted.

Figure 13:
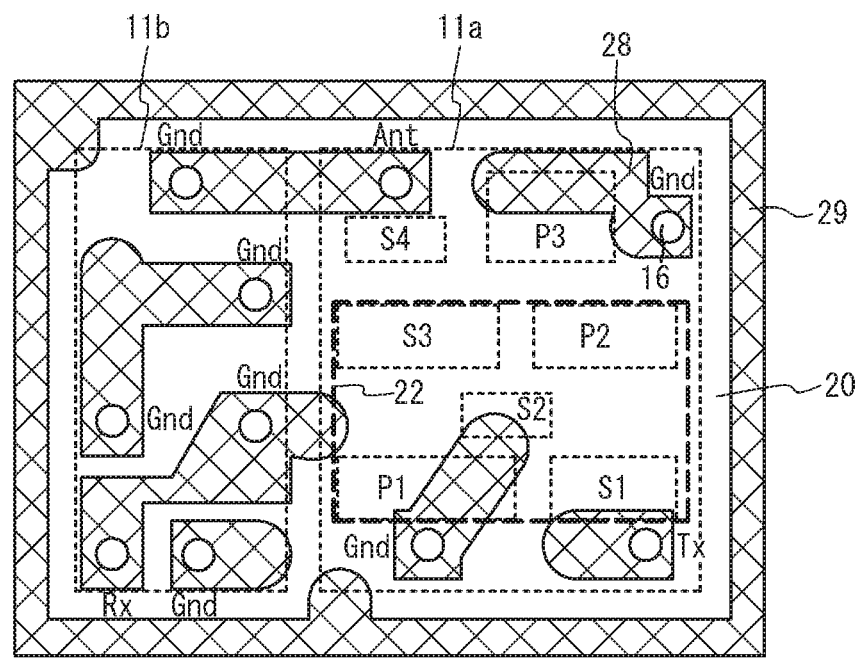
FIG. 13 is a plan view of the substrate in a third variation of the second embodiment.

FIG. 13 is a plan view of the substrate in a third variation of the second embodiment. The resonator that marks the maximum temperature is the series resonator S2. Thus, as illustrated in FIG. 13, the insulating film 22 is made to overlap with the series resonators S1 through S3 and the parallel resonators P1 and P2, which are adjacent to the series resonator S2, in plan view, and is made to overlap with neither the series resonator S4 nor the parallel resonator P3, which is not adjacent to the series resonator S2. This structure allows for efficient heat release from the series resonator S2, and reduces the deterioration of the characteristics due to the overlap with the insulating film 22. The insulating film 22 may overlap with the entire of the resonator in each resonator of the series resonators S1 through S3 and the parallel resonators P1 and P2, but may overlap with a part of the resonator in each resonator. Other structures are the same as those of the second embodiment, and the description thereof is thus omitted.

Figure 14:
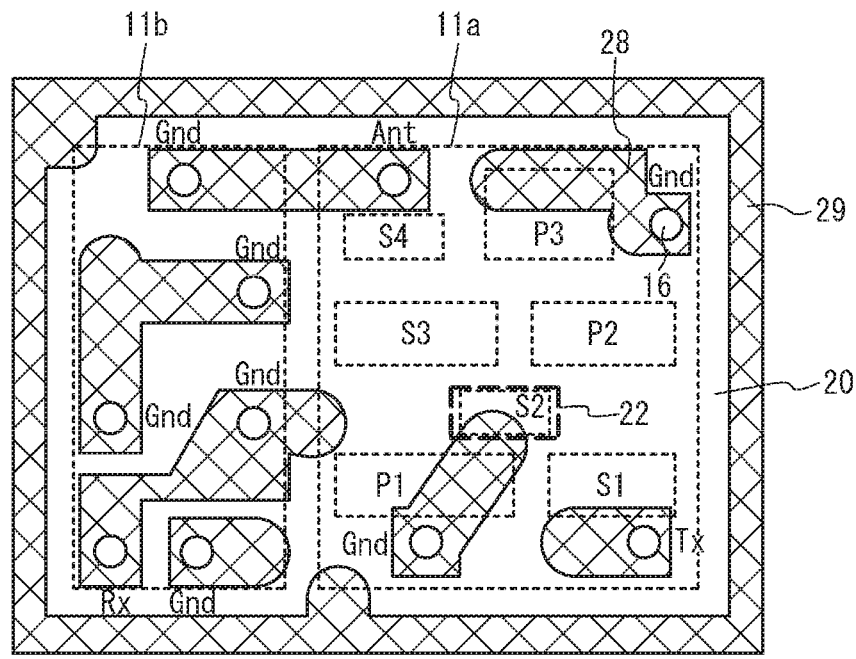
FIG. 14 is a plan view of the substrate in a fourth variation of the second embodiment.

FIG. 14 is a plan view of the substrate in a fourth variation of the second embodiment. As illustrated in FIG. 14, the insulating film 22 overlaps with the series resonator S2 in plan view, and overlaps with none of the series resonator S1, S3, and S4 and the parallel resonators P1 through P3 in plan view. This structure allows for efficient heat release from the series resonator S2 and reduces the deterioration of the characteristics due to the overlap with the insulating film 22. The insulating film 22 may overlap with the entire of the series resonator S2, but may overlap with only a part of the series resonator S2. Other structures are the same as those of the second embodiment, and the description thereof is thus omitted.

As in the third and fourth variations of the second embodiment, the insulating film 22 is provided so as to overlap with one or some of the functional elements 12a and not to overlap with the remaining functional element of the functional elements 12a. This structure enhances the heat release performance and reduces the deterioration of the characteristics.

In the ladder-type filter, the series resonator generates more heat than the parallel resonator. Thus, the insulating film 22 is provided so as to overlap with at least one of one or more series resonators S1 through S4 in plan view and not to overlap with at least one of the remaining resonators of one or more series resonators S1 through S4 and one or more parallel resonators P1 through P3. This structure enhances the heat release performance, and reduces the deterioration of the characteristics.

The resonator of which the both ends are coupled to series resonators among the series resonators S1 through S4 generates more heat. Thus, the insulating film 22 is provided so as to overlap with the series resonator S2 of which the both ends are coupled to the series resonators S1 and S3 among one or more series resonators S1 through S4, and not to overlap with at least one of the remaining resonators of one or more series resonators S1 through S4 and one or more parallel resonators P1 through P3. This structure enhances the heat release performance and inhibits the deterioration of the characteristics.

Figure 15:
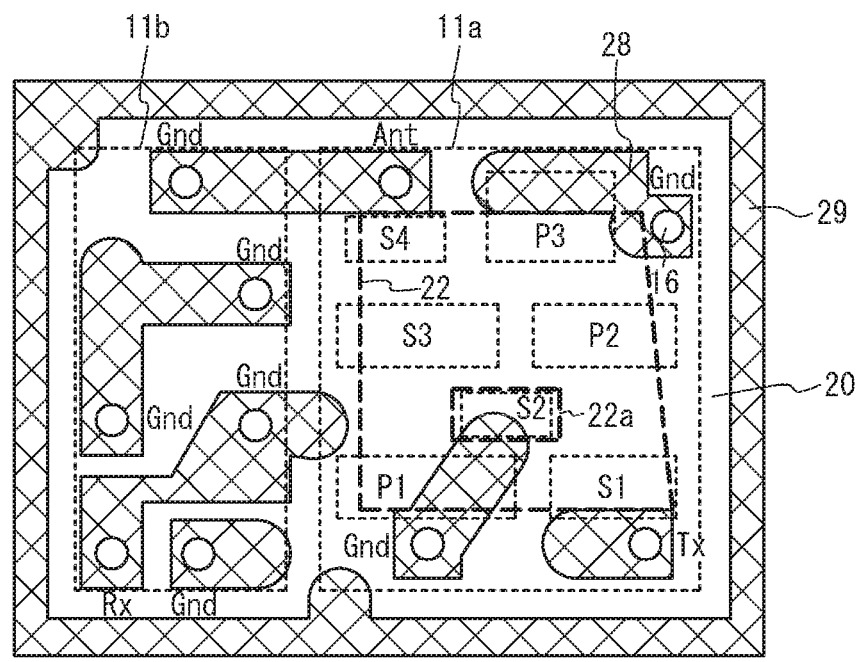
FIG. 15 is a plan view of the substrate in a fifth variation of the second embodiment.

FIG. 15 is a plan view of the substrate in a fifth variation of the second embodiment. As illustrated in FIG. 15, an insulating film 22a overlapping with the series resonator S2 in plan view is made to be thicker than the insulating film 22 overlapping with the remaining series resonators S1, S3, and S4 and the parallel resonators P1 through P3. This structure allows for efficient heat release from the series resonator S2, and reduces the deterioration of the characteristics. Other structures are the same as those of the second embodiment, and the description thereof is thus omitted.

Figure 16:
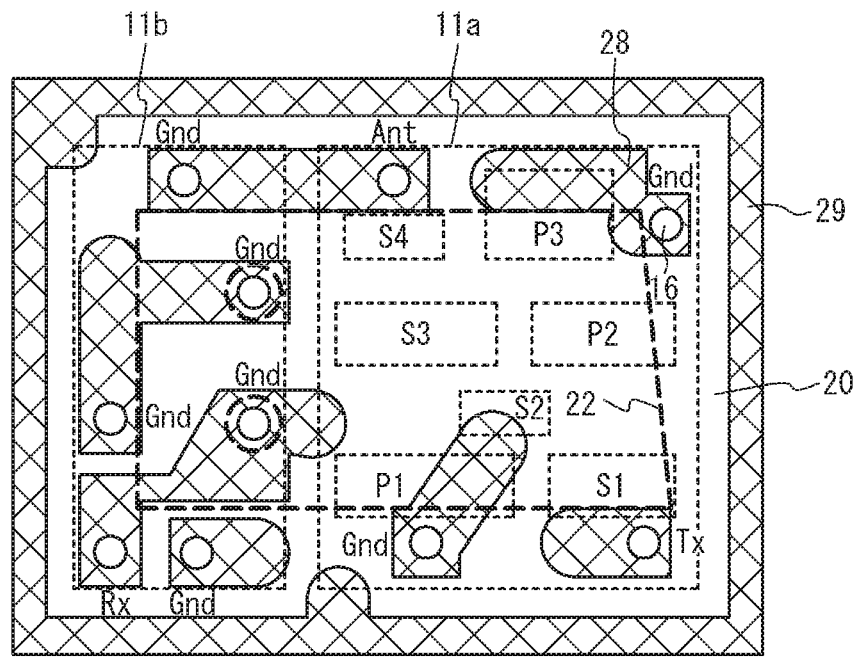
FIG. 16 is a plan view of a substrate in a sixth variation of the second embodiment.

FIG. 16 is a plan view of the substrate in a sixth variation of the second embodiment. As illustrated in FIG. 16, the insulating film 22 is provided so as to overlap with the functional element 12b of the device chip 11b. A plurality of substrates 10a and 10b may be mounted on the substrate 20, and the insulating film 22 may be overlap with all the functional elements 12a and 12b respectively located on the substrates 10a and 10b. Other structures are the same as those of the second embodiment, and the description thereof is thus omitted.

The second embodiment and the variations thereof describe a case where the functional elements 12a and 12b are surface acoustic wave resonators, but the functional elements 12a and 12b may be piezoelectric thin film resonators. The number of series resonators and the number of parallel resonators included in the ladder-type filter are freely selected. A ladder-type filter is described as an example of the filter, but the filter may be a multimode filter. A duplexer is described as an example of the multiplexer, but the multiplexer may be a triplexer or a quadplexer.

In the first and second embodiments and the variations thereof, the functional element 12 may be an active element such as an amplifier and/or a switch. Alternatively, the functional element 12 may be a passive element such as an inductor and/or a capacitor.

Although the embodiments of the present invention have been described in detail, it is to be understood that the various change, substitutions, and alterations could be made hereto without departing from the spirit and scope of the invention.

What is claimed is:
1. An electronic component comprising:
a first substrate;
a second substrate that includes a functional element formed on a lower surface of the second substrate, the second substrate being mounted on the first substrate so that the functional element faces an upper surface of the first substrate across an air gap; and
an insulating film that is located on the upper surface of the first substrate, overlaps with at least a part of the functional element in plan view, faces the functional element across the air gap, that has a film thickness that is more than half of a distance between a lower surface of the functional element and the upper surface of the first substrate, and that is made of an organic insulating material, a thermal conductivity of the insulating film being more than five times a thermal conductivity of air.

2. The electronic component according to claim 1, wherein
a metal layer through which a high-frequency signal propagates is located on the upper surface of the first substrate, and
the insulating film does not overlap with the metal layer in plan view.

3. The electronic component according to claim 1, wherein
a metal layer is located on the upper surface of the first substrate, and
the insulating film overlaps with none of the metal layer in plan view.

4. The electronic component according to claim 1, wherein
the insulating film is in contact with the upper surface of the first substrate.

5. The electronic component according to claim 1, wherein
the functional element is an acoustic wave element.

6. The electronic component according to claim 5, further comprising:
a filter including the acoustic wave element.

7. The electronic component according to claim 6, further comprising;
a multiplexer including the filter.

8. An electronic component comprising:
a first substrate;
a second substrate that includes a functional element formed on a lower surface of the second substrate, the second substrate being mounted on the first substrate so that the functional element faces an upper surface of the first substrate across an air gap; and
an insulating film that is located on the upper surface of the first substrate, overlaps with at least a part of the functional element in plan view, faces the functional element across the air gap, and has a film thickness that is more than half of a distance between a lower surface of the functional element and the upper surface of the first substrate,
wherein
a plurality of functional elements are located on the lower surface of the second substrate, and
the insulating film overlaps with one or some of the plurality of functional elements and does not overlap with a remaining functional element of the plurality of functional elements.

9. An electronic component comprising:
a first substrate;
a second substrate that includes an acoustic wave element formed on a lower surface of the second substrate, the second substrate being mounted on the first substrate so that the acoustic wave element faces an upper surface of the first substrate across an air gap;
an insulating film that is located on the upper surface of the first substrate, overlaps with at least a part of the acoustic wave element in plan view, faces the acoustic wave element across the air gap, and has a film thickness that is more than half of a distance between a lower surface of the acoustic wave element and the upper surface of the first substrate;

one or more series resonators that are connected in series between an input terminal and an output terminal and are the acoustic wave element; and one or more parallel resonators that are connected in parallel between the input terminal and the output terminal and are the acoustic wave element, wherein the insulating film overlaps with at least one of the one or more series resonators in plan view, and does not overlap with at least one of a remaining resonator of the one or more series resonators and the one or more parallel resonators in plan view.

10. The electronic component according to claim 9, wherein the insulating film overlaps with a series resonator of which both ends are coupled to series resonators among the one or more series resonators, and does not overlap with at least one of a remaining resonator of the one or more series resonators and the one or more parallel resonators.

\* \* \* \* \*